(12) United States Patent
Otremba et al.

(10) Patent No.: US 10,037,934 B2
(45) Date of Patent: Jul. 31, 2018

(54) SEMICONDUCTOR CHIP PACKAGE HAVING CONTACT PINS AT SHORT SIDE EDGES

(71) Applicant: Infineon Technologies Austria AG, Villach (AT)

(72) Inventors: Ralf Otremba, Kaufbeuren (DE); Chooi Mei Chong, Melaka (MY); Raynold Talavera Corocotchia, Melaka (MY); Teck Sim Lee, Melaka (MY); Sanjay Kumar Murugan, Malacca (MY); Klaus Schiess, Allensbach (DE); Chee Voon Tan, Seremban (MY); Wee Boon Tay, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/016,039

(22) Filed: Feb. 4, 2016

(65) Prior Publication Data

US 2016/0233149 A1 Aug. 11, 2016

(30) Foreign Application Priority Data

Feb. 5, 2015 (DE) .......................... 10 2015 101 674

(51) Int. Cl.
*H01L 23/495* (2006.01)
*H01L 23/31* (2006.01)
(Continued)

(52) U.S. Cl.
CPC .... *H01L 23/49541* (2013.01); *H01L 23/3107* (2013.01); *H01L 23/492* (2013.01);
(Continued)

(58) Field of Classification Search
CPC .................. H01L 23/49541; H01L 23/495
See application file for complete search history.

(56) References Cited

U.S. PATENT DOCUMENTS 5,902,959 A * 5/1999 Ewer .................... H01L 23/3107
174/538
6,911,718 B1 * 6/2005 Alegre ................ H01L 23/3135
257/666
(Continued)

FOREIGN PATENT DOCUMENTS

CN 1179626 A 4/1998
CN 101174602 A 5/2008
(Continued)

*Primary Examiner* — Stephen Bradley
(74) *Attorney, Agent, or Firm* — Murphy, Bilak & Homiller, PLLC

(57) ABSTRACT

A semiconductor chip package includes a semiconductor chip, an encapsulation body encapsulating the semiconductor chip, a chip pad, and electrical contact elements connected with the semiconductor chip and extending outwardly. The encapsulation body has six side faces and the electrical contact elements extend exclusively through two opposing side faces which have the smallest surface areas from all the side faces. The semiconductor chip is disposed on the chip pad, and a main face of the chip pad remote from the semiconductor chip is at least partially exposed to the outside.

17 Claims, 3 Drawing Sheets

(51) Int. Cl.
*H01L 23/492* (2006.01)
*H01L 23/00* (2006.01)

(52) U.S. Cl.
CPC .. *H01L 23/49551* (2013.01); *H01L 23/49568* (2013.01); *H01L 24/48* (2013.01); *H01L 24/49* (2013.01); *H01L 2224/32245* (2013.01); *H01L 2224/48091* (2013.01); *H01L 2224/48247* (2013.01); *H01L 2224/48472* (2013.01); *H01L 2224/49171* (2013.01); *H01L 2224/73265* (2013.01); *H01L 2924/00014* (2013.01); *H01L 2924/181* (2013.01)

(56) References Cited

U.S. PATENT DOCUMENTS

| | | | |
|---|---|---|---|
| 7,034,385 B2* | 4/2006 | Ambrus | H01L 23/3107 257/107 |
| 7,208,818 B2 | 4/2007 | Luo et al. | |
| 8,008,758 B1* | 8/2011 | Kim | H01L 23/49541 257/666 |
| 8,227,908 B2* | 7/2012 | Otremba | H01L 21/561 257/690 |
| 2003/0062608 A1 | 4/2003 | Hamachi | |
| 2005/0093143 A1* | 5/2005 | Chiang | G11C 5/04 257/723 |
| 2007/0102801 A1 | 5/2007 | Ishida et al. | |
| 2008/0203548 A1* | 8/2008 | Sun | H01L 23/492 257/672 |
| 2009/0001530 A1 | 1/2009 | Goto | |
| 2010/0164080 A1 | 7/2010 | Goto | |
| 2010/0193924 A1 | 8/2010 | Goto | |
| 2011/0210432 A1 | 9/2011 | Goto | |

FOREIGN PATENT DOCUMENTS

| | | |
|---|---|---|
| EP | 2779232 A2 | 9/2014 |
| JP | 2008166621 A | 7/2008 |

* cited by examiner

SEMICONDUCTOR CHIP PACKAGE HAVING CONTACT PINS AT SHORT SIDE EDGES

PRIORITY CLAIM

This application claims priority to German Patent Application No. 10 2015 101 674.5 filed on 5 Feb. 2015, the content of said application incorporated herein by reference in its entirety.

TECHNICAL FIELD

The present disclosure relates to the field of semiconductor chip packages.

BACKGROUND

A semiconductor package may comprise a semiconductor chip, an encapsulation body encapsulating the semiconductor chip, and electrical contact elements connected with the semiconductor chip and extending through the encapsulation body in an outward direction. The electrical contact elements can be formed in a different way for serving different desires or requirements on the customer's side. According to one variant the semiconductor package is formed as a through-hole device in which the electrical contact elements are formed as contact pins to be inserted in through-hole sockets on the customer's side. According to another variant the semiconductor package is formed as a surface mount device in which the electrical contact elements are formed with flat coplanar lower surfaces to be attached on a suitable contact surface on the customer's side. For the fabrication of semiconductor chip packages and their electrical contact elements other aspects have to be taken also into consideration. One aspect may be that the semiconductor chip may produce heat during operation and the complete design of the semiconductor chip package may have to be optimized to facilitate most efficient heat dissipation. Another aspect concerns the fabrication process of the semiconductor chip package, in particular the problem of how to increase the leadframe density in the fabrication process and thereby to decrease the fabrication costs per each semiconductor chip package.

SUMMARY

According to an embodiment of a semiconductor chip package, the semiconductor chip package comprises a semiconductor chip, an encapsulation body encapsulating the semiconductor chip, electrical contact elements connected with the semiconductor chip and extending outwardly, and a chip pad on which the semiconductor chip is disposed. The encapsulation body has six side faces and the electrical contact elements extending exclusively through two opposing side faces which have the smallest surface areas from all the side faces. The chip pad has a main face remote from the semiconductor chip and at least partially exposed to the outside.

According to another embodiment of a semiconductor chip package, the semiconductor chip package comprises a chip pad, a semiconductor chip disposed on the chip pad, an encapsulation body encapsulating the semiconductor chip, and electrical contact elements connected with the semiconductor chip and extending outwardly. The encapsulation body has a rectangular shape and the electrical contact elements extend exclusively through two opposing short sides of the rectangle and a main face of the chip pad remote from the semiconductor chip is at least partially exposed to the outside.

According to yet another embodiment of a semiconductor chip package, the semiconductor chip package comprises a leadframe comprising a chip pad and electrical contact elements, a semiconductor chip disposed on the chip pad, and an encapsulation body encapsulating the semiconductor chip and a portion of the leadframe in such a way that a main face of the chip pad remote from the semiconductor chip is exposed to the outside. The electrical contact elements are connected with the semiconductor chip and extend outwardly.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
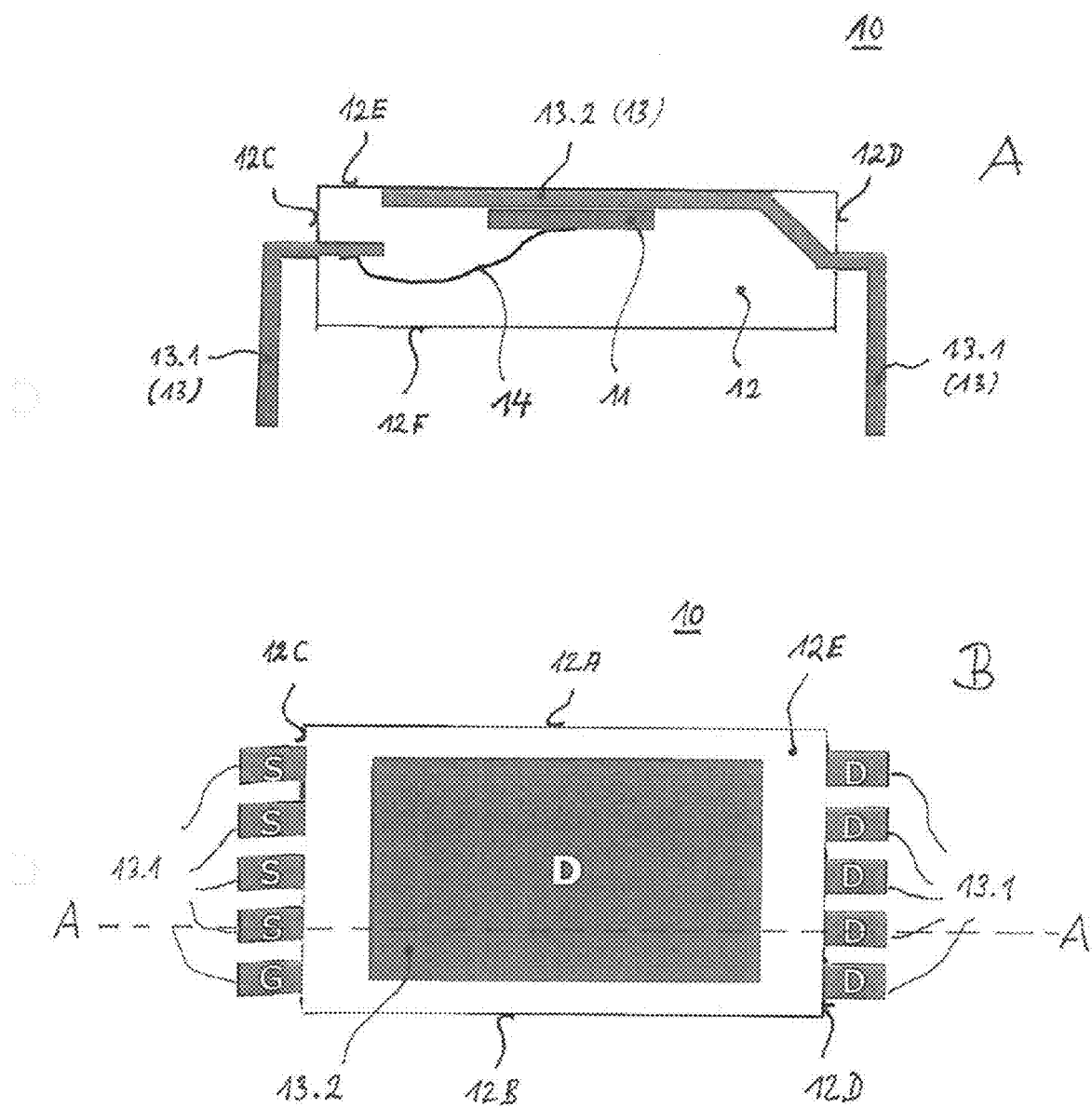
FIG. 1 shows a schematic cross-sectional side view representation (A) and a top view representation (B) of an example of a semiconductor chip package comprising an exposed chip pad and pin-like electrical contact elements according to an example.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Devices or semiconductor packages containing semiconductor chips are described below. The semiconductor chips may be of different types, may be manufactured by different technologies and may include for example integrated electrical, electro-optical or electro-mechanical circuits and/or passives. The semiconductor chips may, for example, be designed as logic integrated circuits, analog integrated circuits, mixed signal integrated circuits, power integrated circuits, memory circuits or integrated passives. They may include control circuits, microprocessors or micro-electro-mechanical components. Further, they may be configured as power semiconductor chips, such as power MOSFETs (Metal-oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements in particular on its two main faces, that is to say on its top side and bottom side. In particular, power semiconductor chips may have a vertical structure. By way of example, the source electrode and gate electrode of a power MOSFET may be situated on one main face, while the drain electrode of the power MOSFET is arranged on the other main face. Furthermore, the electronic modules described below may include integrated circuits to control the integrated circuits of other semiconductor chips, for example the integrated circuits of power semiconductor chips. The semiconductor chips can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The semiconductor chips or at least parts of the semiconductor chips are covered with an encapsulating material to form an encapsulation (e.g. a molded body), which may be electrically insulating. The encapsulation may be a dielectric material and may be made of any appropriate duroplastic, thermoplastic or thermosetting material or laminate (prepreg). The encapsulant may contain filler materials. After its deposition, the encapsulant may be only partially hardened and may be completely hardened after application of energy (e.g. heat, UV light, etc.) to form an encapsulant. Various techniques may be employed to cover the semiconductor chips with the encapsulant, for example compression molding, injection molding, powder molding, liquid molding, dispensing or laminating.

FIG. 1 shows an example of a semiconductor chip package 10 according to an example in a schematic cross-sectional side view representation (A) and in a top view representation (B). The cross-sectional representation (A) has been taken in a plane as indicated by line A-A in the top view representation (B). The semiconductor chip package 10 comprises a semiconductor chip 11, an encapsulation body 12 encapsulating the semiconductor chip 11, a chip pad 13.2 having the semiconductor chip 11 disposed thereon, and electrical contact elements 13.1 connected with the semiconductor chip 11 and extending through the encapsulation body 12 in an outward direction. The encapsulation body 12 comprises six side faces 12A to 12F. The electrical contact elements 13.1 extend exclusively through two opposing side faces 12C and 12D which have the smallest surface areas from all the side faces 12A to 12F. A main face of the chip pad 13.2 remote from the semiconductor chip 11 is at least partially exposed to the outside.

According to an example of the semiconductor chip package 10 of FIG. 1, the six side faces 12A to 12F comprise two opposing main faces 12E and 12F which have the largest surface areas from all the side faces 12A to 12F. The semiconductor chip 11 can be disposed within the encapsulation body 12 in such a way that the main plane of the chip is arranged in parallel to the two main faces 12E and 12F.

According to an example of the semiconductor chip package 10 of FIG. 1, the semiconductor chip package 10 comprises a leadframe 13 comprising the electrical contact elements 13.1 and the chip pad 13.2. In the example shown in FIG. 1, the complete upper main face of the chip pad 13.2 is exposed to the outside. It can, however, also be the case that only a portion of the upper main face of the chip pad 13.2 is exposed to the outside. Anyway, such a configuration allows the user to attach a heat sink onto the semiconductor chip package 10 so that excessive heat produced by the semiconductor chip 11 can be effectively dissipated. In this way it is possible to effectively spatially separate the electrical and thermal pathways from each other as a major amount of the heat will be dissipated through the chip pad 13.2 and the heat sink.

According to an example of the semiconductor chip package 10 of FIG. 1, the chip pad 13.2 is connected with one or more of the electrical contact elements 13.1. It can, for example, be contiguous with one or more of the electrical contact elements 13.1, in particular be formed out of a portion of a leadframe. According to another example the chip pad is not connected to anyone of the electrical contact elements.

According to an example of the semiconductor chip package 10 of FIG. 1, the electrical contact elements 13.1 are configured as contact pins as shown in the schematic cross-sectional side view representation (A) so that the package is construed as a through-hole device. According to another example, the semiconductor chip package can also be construed as a surface mount device. An embodiment thereof will be shown later.

According to an example of the semiconductor chip package 10 of FIG. 1, the electrical contact elements 13.1 comprise first electrical contact elements arranged at the side face 12D and being contiguous with the chip pad 13.2, and second electrical contact elements 13.1 arranged at the side face 12C not being contiguous with the chip pad 13.2. More specifically, it can be the case that the semiconductor chip 11 is comprised of an insulated gate bipolar transistor (IGBT) having a drain contact pad at an upper surface thereof and a gate contact pad arranged on a lower surface, a source contact pad arranged on the lower surface, and a source sense contact pad arranged on the lower surface. In this case the first electrical contact elements 13.1, arranged at the side face 12D, are all electrically connected with the chip pad 13.2 and thus with the drain contact element and are therefore designated with "D" in the top view representation (B). The second electrical contact elements 13.1 are designated with "S" and "G" in the top view representation (B) which means that they are connected by wire bonds 14 to either one of the gate, source or source sense contact pads on the lower surface of the semiconductor chip 11. A specific embodiment thereof will be shown and explained in greater detail in connection with FIG. 3.

According to an example of the semiconductor chip package 10 of FIG. 1, the semiconductor chip package 10 comprises one and only one semiconductor chip 11 as shown in FIG. 1 or it may also contain more than one semiconductor chip. It may also contain one or more semiconductor chips and, in addition thereto, one or more passive devices like e.g. resistors, inductors or capacitors which may also be arranged on portions of the leadframe. According to an example, the semiconductor chip 11 comprises one or more of a transistor, a metal-oxide semiconductor transistor, a vertical transistor, an insulated gate bipolar transistor, and a power transistor.

According to an example of the semiconductor chip package 10 of FIG. 1, the encapsulation body 12 comprises a rectangular cross-section as shown in the schematic cross-sectional side view representation (A) and the electrical contact elements 13.1 extend exclusively through two opposing short sides of the rectangle which correspond to the side faces designated with the reference numbers 12C and 12D in the schematic cross-sectional side view representation (A). According to an example thereof, a ratio between a length of the long side of the rectangle, i.e. a length of one of the side faces 12E and 12F, and a length of the short side of the rectangle, i.e. a length of one of the side faces 12C and 12D, is between 2 and 3 or greater than 3.

According to an example of the semiconductor chip package 10 of FIG. 1, the semiconductor chip package 10 comprises the form of a cuboid. A length of the semiconductor chip package 10 may be defined as a distance between the side faces 12C and 12D, a width of the semiconductor chip package 10 may be defined as a distance between the side faces 12A and 12B, and a height of the semiconductor chip package 10 may be defined as a distance between the side faces 12E and 12F. According to an example, the length of the semiconductor chip package 10 may be in a range from 10 mm to 25 mm, the width of the semiconductor chip package 10 may be in a range from 4 mm to 10 mm, and the height of the semiconductor chip package 10 may be in a range from 1 mm to 4 mm.

Figure 2:
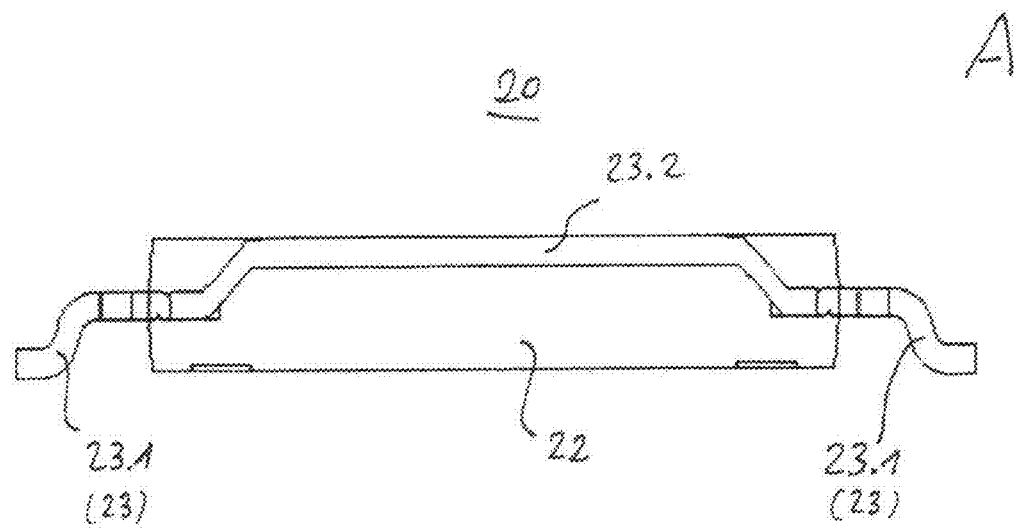
FIG. 2 shows a schematic cross-sectional side view representation (A) and a schematic perspective top view representation (B) of a semiconductor chip package comprising an exposed chip pad and electrical contact elements designed for surface mounting technology according to an example.
Figure 2:
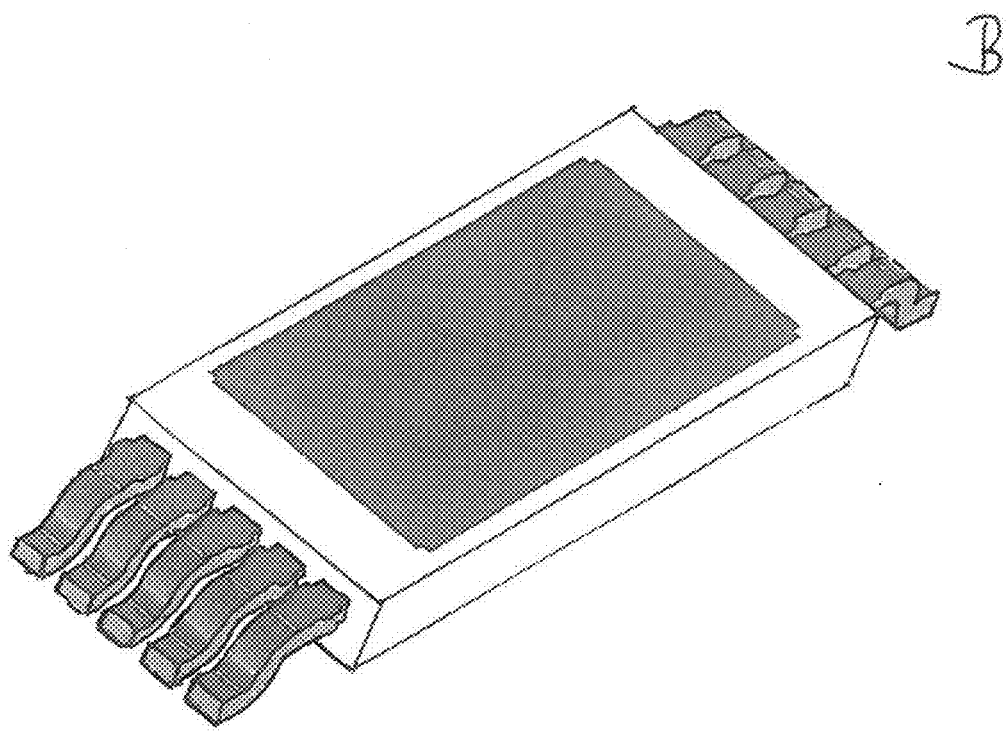

FIG. 2 shows an example of a semiconductor chip package 20 being construed as a surface mount device in a cross-sectional representation (A) and in a perspective top view representation (B). The semiconductor chip package 20 of FIG. 2 comprises a semiconductor chip (not shown), an encapsulation body 22, and electrical contact elements 23.1 connected with the semiconductor chip and extending through the encapsulation body 22 in an outward direction. The electrical contact elements 23.1 first extend in a lateral direction such as the electrical contact elements 13.1 of the example of FIG. 1, but are then bent in such a way that their lower surfaces are coplanar so that the semiconductor chip package 20 can be used as a surface mount device on the customer's side.

The other details of the semiconductor chip package 20 of FIG. 2 may be similar to those of the example as shown in FIG. 1. In particular, the electrical contact elements 23.1 may be part of a leadframe 23, wherein the leadframe 23 further comprises a chip pad 23.2 to which the semiconductor chip is attached.

Figure 3:
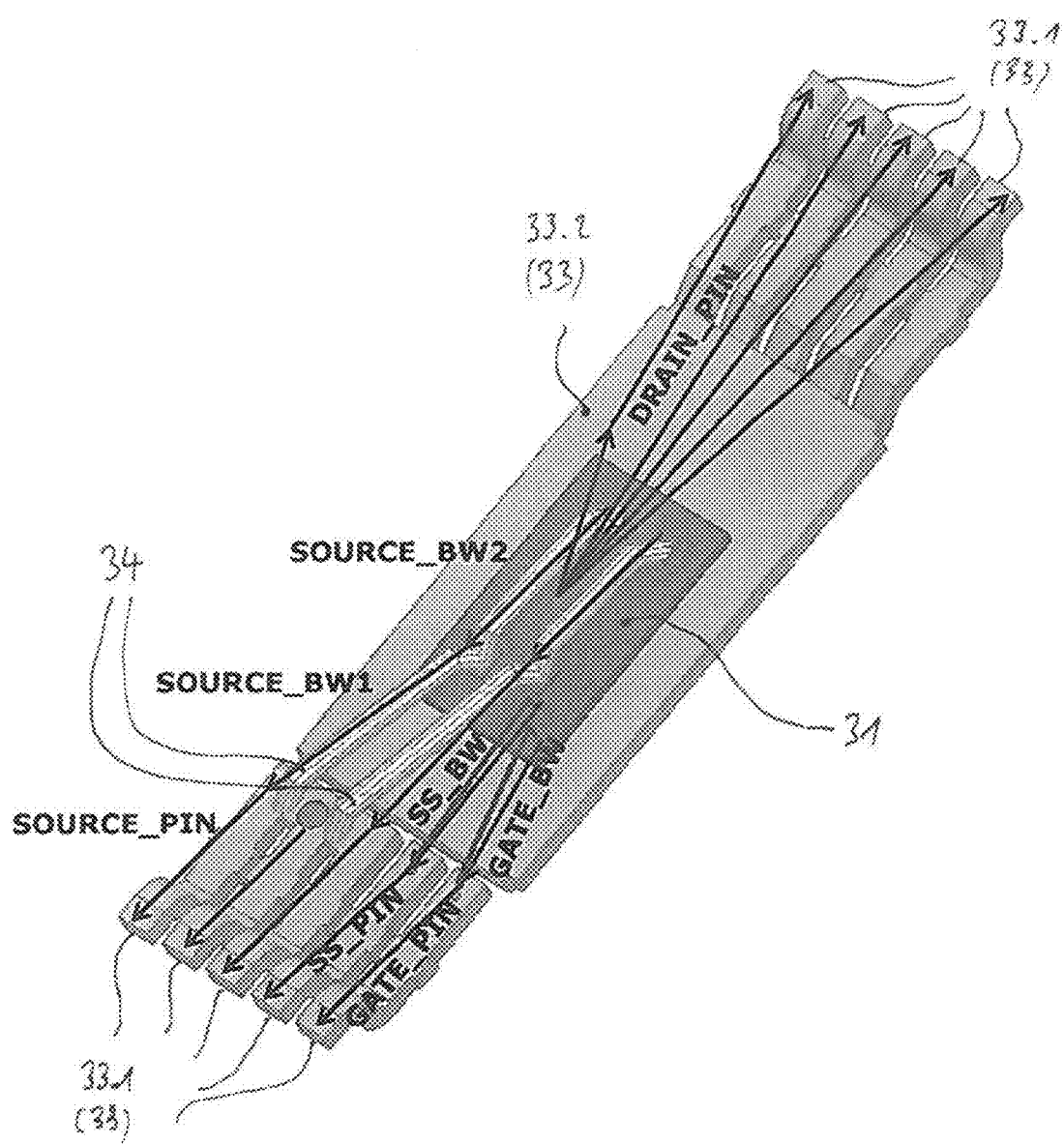
FIG. 3 shows a schematic perspective down view representation of an exemplary assembly which is yet to be encapsulated to form a semiconductor chip package.

FIG. 3 shows an assembly comprising a leadframe 33 and a semiconductor chip 31 connected to the leadframe 33. The assembly, as shown in FIG. 3, shows how the semiconductor chip package 20 of FIG. 2 may have looked like in a perspective down view representation before applying the encapsulation body 22 to it. The semiconductor chip 31 may be comprised of an insulated gate bipolar (IGB) transistor being attached with its drain pad surface to the chip pad 33.2. The upper right electrical contact elements 33.1 are contiguous with the chip pad 33.2 and thus on the same electrical potential as the drain contact. The upper surface of the semiconductor chips 31 comprise a large source pad area and small gate pad and source sense areas. The large source pad area is connected to three ones of the lower left electrical contact elements 33.1 by means of two wire bonds 34 which are both connected to two different contact areas of the large source contact pad. The other two lower left electrical contact elements 33.1 are connected with wire bonds to the gate and source sense pads.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip package, comprising:
   an electrically conductive leadframe comprising a chip pad, a first plurality of electrical contact elements in contiguous connection with the chip pad, and a second plurality of electrical contact elements electrically isolated from the chip pad, a first subset of the second plurality of electrical contact elements being in contiguous connection with each other, and a second subset of the second plurality of electrical contact elements being separate from each other and from the electrical contact elements of the first subset;
   a semiconductor chip attached to the chip pad, the semiconductor chip comprising a source contact pad disposed on a main face of the semiconductor chip remote from the chip pad;
   a plurality of wire bonds connecting the first subset of the second plurality of electrical contact elements to the source contact pad, wherein the wire bonds are connected to at least two different contact areas of the source contact pad; and
   an encapsulation body encapsulating the semiconductor chip;

wherein the encapsulation body has six side faces and the first plurality of electrical contact elements and the second plurality of electrical contact elements extend exclusively through two opposing side faces which have the smallest surface areas from all the side faces;
wherein the chip pad has a main face remote from the semiconductor chip and at least partially exposed to the outside at a first side face of the encapsulation body having the largest surface area,
wherein the first plurality of electrical contact elements and the second plurality of electrical contact elements extend towards a second side face of the encapsulation body opposite the first side face, so that the semiconductor chip package has a mounting configuration in which the at least partially exposed main face of the chip pad faces away from a contact surface to which the first plurality of electrical contact elements and the second plurality of electrical contact elements are to be attached,
wherein the first plurality of electrical contact elements extends from a first side face of two opposing side faces at a first level coplanar with the chip pad, then extend to a second level different from the first level, then extend to a third level different from the first and second levels;
wherein the second plurality of electrical contact elements extends from a second side face of the two opposing side faces at a fourth level coplanar with the chip pad, then extend to a fifth level different from the fourth level, wherein the fifth level and the third level are coplanar.

2. The semiconductor chip package of claim 1, wherein the semiconductor chip comprises one or more of a transistor, a metal-oxide semiconductor transistor, a vertical transistor, an insulated gate bipolar transistor, and a power transistor.

3. The semiconductor chip package of claim 1, wherein the encapsulation body has a rectangular shape and the first plurality of electrical contact elements and the second plurality of electrical contact elements extend exclusively through two opposing short sides of the rectangle.

4. The semiconductor chip package of claim 3, wherein a ratio between a length of the long side of the rectangle and a length of the short side of the rectangle is between 2 and 3 or greater than 3.

5. The semiconductor chip package of claim 1, wherein the semiconductor chip comprises a plurality of electrical devices.

6. The semiconductor chip package of claim 1, wherein the semiconductor package comprises a plurality of semiconductor chips.

7. The semiconductor chip package of claim 1, wherein the semiconductor package is a surface mounted device.

8. A semiconductor chip package, comprising:
an electrically conductive leadframe comprising a chip pad, a first plurality of electrical contact elements in contiguous connection with the chip pad, and a second plurality of electrical contact elements electrically isolated from the chip pad, a first subset of the second plurality of electrical contact elements being in contiguous connection with each other, and a second subset of the second plurality of electrical contact elements being separate from each other and from the electrical contact elements of the first subset;
a semiconductor chip disposed on the chip pad, the semiconductor chip comprising a source contact pad disposed on a main face of the semiconductor chip remote from the chip pad;
a plurality of wire bonds connecting the first subset of the second plurality of electrical contact elements to the source contact pad, wherein the wire bonds are connected to at least two different contact areas of the source contact pad; and
an encapsulation body encapsulating the semiconductor chip;
wherein the encapsulation body has a rectangular shape and the first plurality of electrical contact elements and the second plurality of electrical contact elements extend exclusively through two opposing short sides of the rectangle,
wherein a main face of the chip pad remote from the semiconductor chip is at least partially exposed to the outside at a first long side of the rectangle which is transverse to the two opposing short sides of the rectangle,
wherein the first plurality of electrical contact elements and the second plurality of electrical contact elements extend towards a second long side of the rectangle opposite the first long side, so that the semiconductor chip package has a mounting configuration in which the at least partially exposed main face of the chip pad faces away from a contact surface to which the first plurality of electrical contact elements and the second plurality of electrical contact elements are to be attached,
wherein the first plurality of electrical contact elements extends from a first side face of two opposing side faces at a first level coplanar with the chip pad, then extend to a second level different from the first level, then extend to a third level different from the first and second levels;
wherein the second plurality of electrical contact elements extends from a second side face of the two opposing side faces at a fourth level coplanar with the chip pad, then extend to a fifth level different from the fourth level, wherein the fifth level and the third level are coplanar.

9. The semiconductor chip package of claim 8, wherein a ratio between a length of the first and second long sides of the rectangle and a length of the two opposing short sides of the rectangle is between 2 and 3 or greater than 3.

10. The semiconductor chip package of claim 8, wherein a length of the first and second long sides of the rectangle is in a range from 10 mm to 25 mm, and a length of the two opposing short sides of the rectangle is in a range from 4 mm to 10 mm.

11. The semiconductor chip package of claim 8, wherein the first plurality of electrical contact elements and the second plurality of electrical contact elements are then bent in such a way that their lower surfaces are coplanar.

12. A semiconductor chip package, comprising:
a leadframe comprising a chip pad, a first plurality of electrical contact elements in contiguous connection with the chip pad, and a second plurality of electrical contact elements electrically isolated from the chip pad, a first subset of the second plurality of electrical contact elements being in contiguous connection with each other, and a second subset of the second plurality of electrical contact elements being separate from each other and from the electrical contact elements of the first subset;

a semiconductor chip disposed on the chip pad, the semiconductor chip comprising a source contact pad disposed on a main face of the semiconductor chip remote from the chip pad;

a plurality of wire bonds connecting the first subset of the second plurality of electrical contact elements to the source contact pad, wherein the wire bonds are connected to at least two different contact areas of the source contact pad; and an encapsulation body encapsulating the semiconductor chip and a portion of the leadframe in such a way that a main face of the chip pad remote from the semiconductor chip is at least partly exposed to the outside at a first long side of the encapsulation body, wherein the electrical contact elements are connected with the semiconductor chip and extend outwardly through two opposing short sides of the encapsulation body which are transverse to the first long side, wherein the first plurality of electrical contact elements and the second plurality of electrical contact elements extend towards a second long side of the encapsulation body opposite the first long side, so that the semiconductor chip package has a mounting configuration in which the at least partially exposed main face of the chip pad faces away from a contact surface to which the first plurality of electrical contact elements and the second plurality of electrical contact elements are to be attached, wherein the first plurality of electrical contact elements extends from a first side face of two opposing side faces at a first level coplanar with the chip pad, then extend to a second level different from the first level, then extend to a third level different from the first and second levels;

wherein the second plurality of electrical contact elements extends from a second side face of the two opposing side faces at a fourth level coplanar with the chip pad, then extend to a fifth level different from the fourth level, wherein the fifth level and the third level are coplanar.

13. The semiconductor chip package of claim 12, wherein the semiconductor chip comprises one or more of a transistor, a metal-oxide semiconductor transistor, a vertical transistor, an insulated gate bipolar transistor, and a power transistor.

14. The semiconductor chip package of claim 12, wherein a main face of the semiconductor chip package comprises a central portion formed by the at least partially exposed main face of the chip pad and an edge portion formed by a portion of the encapsulation body at the first long side of the encapsulation body.

15. The semiconductor chip package of claim 1, wherein the semiconductor chip comprises a gate pad and a source sense pad at the main face of the semiconductor chip remote from the chip pad, wherein the gate pad is connected by a wire bond to a first electrical contact element of the second subset of the second plurality of electrical contact elements, and wherein the source sense pad is connected by a wire bond to a second electrical contact element of the second subset of the second plurality of electrical contact elements.

16. The semiconductor chip package of claim 8, wherein the semiconductor chip comprises a gate pad and a source sense pad at the main face of the semiconductor chip remote from the chip pad, wherein the gate pad is connected by a wire bond to a first electrical contact element of the second subset of the second plurality of electrical contact elements, and wherein the source sense pad is connected by a wire bond to a second electrical contact element of the second subset of the second plurality of electrical contact elements.

17. The semiconductor chip package of claim 12, wherein the semiconductor chip comprises a gate pad and a source sense pad at the main face of the semiconductor chip remote from the chip pad, wherein the gate pad is connected by a wire bond to a first electrical contact element of the second subset of the second plurality of electrical contact elements, and wherein the source sense pad is connected by a wire bond to a second electrical contact element of the second subset of the second plurality of electrical contact elements.

* * * * *